United States Patent [19]

Goser et al.

[11] B 3,999,166

[45] Dec. 21, 1976

[54] STATIC SEMICONDUCTOR STORAGE ELEMENT

[75] Inventors: Karl Goser, Munich; Michael Pomper, Schliersee, both of Germany

[73] Assignee: Siemens Aktiengesellschaft, Berlin & Munich, Germany

[22] Filed: Aug. 6, 1974

[21] Appl. No.: 495,185

[44] Published under the second Trial Voluntary Protest Program on March 9, 1976 as document No. B 495,185.

[30] Foreign Application Priority Data

Aug. 14, 1973 Germany .......................... 2341104
Aug. 6, 1973 Germany .......................... 2339735

[52] U.S. Cl. .......................... 340/173 FF; 307/288

[51] Int. Cl.[2] .................. G11C 11/40; G11C 13/00

[58] Field of Search ................. 340/173 R, 173 FF; 307/279, 288, 290, 292

[56] References Cited

UNITED STATES PATENTS 2,907,895 10/1959 Van Overbeek .................. 307/288

*Primary Examiner*—Terrell W. Fears
*Attorney, Agent, or Firm*—Hill, Gross, Simpson, Van Santen, Steadman, Chiara & Simpson

[57] ABSTRACT

A static semiconductor storage element includes a flip-flop formed of a pair of complementary field effect transistors which are cross coupled without intersection to form a bistable circuit. One node of the flip-flop is connected to a terminal which is employed for both reading and writing functions. The flip-flop is set or reset by connection of an appropriate voltage to the node, and nondestructive read out is carried out by sensing the voltage level of the node.

13 Claims, 6 Drawing Figures

STATIC SEMICONDUCTOR STORAGE ELEMENT

BACKGROUND

1. Field of the Invention

The present invention relates to a static semiconductor storage element, and more particularly to such an element including a pair of complementary field effect transistors.

2. The Prior Art

Many designs for semiconductor storage devices have been developed, including static and dynamic types. One previous static type is disclosed and described in copending U.S. application Ser. No. 457,223, filed Apr. 2, 1974. That application describes a storage element made up of five transistors. Although this design is satisfactory as far as its operation is concerned, the requirement of five transistors, and the various interconnections which are required in order to form an operative circuit, take up a relatively large amount of space.

Static storage devices are preferably formed on a single wafer or "chip" of silicon or other semiconducting or insulating material. This mode of construction greatly reduces the required amount of space, as compared with the use of discrete circuit elements, but the requirement of five transistors in the circuit demands a relatively large area of the substrate for each individual storage element. It is desirable to reduce, as much as possible, the amount of substrate area required for each storage element so as to pack as many storage elements as possible into a single integrated circuit, and it is therefore desirable to design a circuit which requires fewer transistors and fewer and simpler connections among the components.

SUMMARY OF THE PRESENT INVENTION

It is a principal object of the present invention to provide a storage element which may be realized in integrated circuit form with the use of a smaller area of substrate than in other storage elements heretofore known.

Another object of the present invention is to provide a storage element in which the circuit arrangement is simplified, so as to facilitate an increase in the density of such storage elements.

A further object of the present invention is to provide a static storage element which can be readily set to one or another of two stable states and sensed in a way which does not destroy the stored data.

These and other objects and advantages of the present invention will become manifest by an examination of the following description and the accompanying drawings.

In one embodiment of the present invention, a static semiconductor storage element is provided with a pair of complementary field effect transistors, each connected in series with a load, with the gates of the field effect transistors each cross coupled to the node on the opposite side. A selector element is connected to one node, and serves as an input terminal to set the storage element into one of its two stable states and as an output terminal to permit the nondestructive read out of information stored in the storage element. When the selector element is a transistor, it is connected to word and digit lines to accomplish the reading and writing functions. When the selector element is a diode, the diode is connected to a digit line, and two word lines supply different voltage levels to two terminals in the circuit of the storage element.

Relatively high load resistances are employed in series with the field effect transistors. In one embodiment, the load resistances are in the form of resistors; in another, the load resistances are in the form of reverse pole diodes; and, in a further embodiment, the load resistances are in the form of depletion-type field effect transistors.

BRIEF DESCRIPTION OF THE DRAWINGS

Reference will now be made to the accompanying drawings, in which.

DESCRIPTION OF THE PREFERRED EMBODIMENTS

Figure 1:
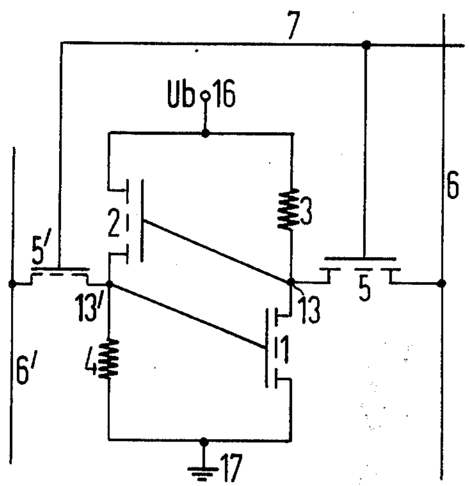
FIG. 1 is a schematic circuit diagram of an illustrative embodiment of a storage element constructed in accordance with the present invention including a selector transistor.

In FIG. 1, the storage element consists of a bistable device made up of two field effect transistors 1 and 2, which are respectively connected in series with load resistors 3 and 4. The two series circuits thus formed are connected between a source of a supply potential at a terminal 16 and ground potential at a terminal 17, with the transistor 1 being connected directly to the terminal 17 and the transistor 2 being connected directly to the terminal 16.

The two transistors 1 and 2 are complementary, in terms of conductivity, so that one is rendered conductive with a relatively high potential applied to its gate, whereas the other requires a relatively low potential connected to its gate in order to become conductive. Specifically, the transistor 1 requires a relatively high gate potential to conduct, and the transistor 2 requires a relatively low gate potential. Accordingly, the flip-flop has two stable states. In one state, both of the transistors are nonconductive, and, in the other state, both of the transistors are conductive. The junction 13 between the transistor 1 and the load 3 is referred to hereinafter as a node. The circuit has a second node 13' between the transistor 2 and the load 4. The potential present at the node 13 is sensed during a reading operation, and its potential is controlled during a writing operation.

A selector transistor 5 is interconnected between node 13 and a line 6, which is hereinafter referred to as a "digit line." The gate of the transistor 5 is connected to a line 7, which is hereinafter referred to as a "word line." The potential on the line 7 controls the conductivity of the transistor 5, so that the storage device may be set into one or another of its stable states in accordance with a specific potential supplied to the digit line 6 during a writing operation. During reading, when the transistor 5 is made conductive by supplying to its gate an appropriate potential on the line 7, the potential at the node 13 is connected through the transistor 5 to the line 6, and is there sensed by a sensing circuit (not shown).

The load resistors 3 and 4 are preferably very high in resistance. The entire circuitry illustrated in FIG. 1 is preferably embodied in a single monolithic semiconductor chip, by use of known techniques. The technique preferably used is the complementary MOS technique, sometimes called the "CMOS" technique, and is preferably carried out on an insulating substrate, such as sapphire or spinel. Such a process is sometimes referred to as an "SOS" process.

If desired, a second selector transistor 5' may be connected between the node 13' and a second digit line 6'. Then the storage device can be set by means of either or both of the two digit lines 6 and 6'. It is significant that the connections between the nodes 13 and 13' and their respective gate terminals do not cross or intersect, a feature which facilitates construction of the storage element and greatly increases the attainable density.

Figure 2:
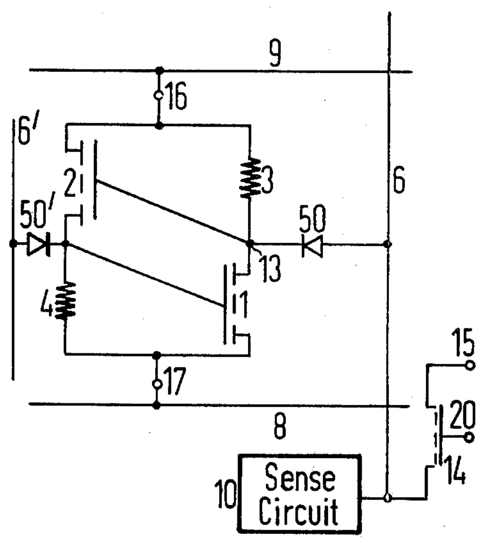
FIG. 2 is a schematic circuit diagram of an alternative embodiment of the present invention which incorporates a selector diode.

Referring now to FIG. 2, an alternative embodiment of the present invention is illustrated, in which a diode 50 is substituted for the selector transistor 5. In addition, two word lines 9 and 8 are employed, one connected to the terminal 16 and the other connected to the terminal 17, to connect two independent sources of voltage to the circuit.

In its quiescent or normal state, the potential levels on the lines 6, 8, and 9 are respectively +3 volts, +3 volts, and +6 volts. The potential at the node 13 then must be between +3 V and +6 V, and is higher or lower in value, depending upon the state of the storage element. The diode 50 is therefore blocked, and only blocking current can flow through the diode.

When a reading operation is performed with the circuit of FIG. 2, the potential on the word line 8 is brought to a lower potential, such as 0 V. Then, if the flip-flop is in its state in which the transistor 1 is conductive, in which the potential at the node 13 is relatively low, this potential drops below +3 V as the potential on the word line 8 is reduced to zero, forward biasing the diode 50 and permitting read-out current to flow through the diode and the digit line 6. The read-out current on the digit line 6 may be sensed by a sense circuit 10.

If the storage device is in its state in which the transistor 1 is nonconductive, the potential at the node 13 is relatively high, and remains greater than +3 V as the voltage on the word line 8 is reduced. The diode 50 therefore remains blocked, and no read-out current flows through the digit line 6. The absence of a read-out current, while the word line 8 is low, is sensed by a sense circuit 10.

In order to set the storage element of FIG. 2 to one or the other of its two stable states, a low potential of 0 V is applied to both word lines 8 and 9, and the potential on the digit line 6 is controlled in accordance with the information to be stored. The potential on the digit line 6 is controlled by a transistor 14, which connects the digit line 6 to a source of potential at a terminal 15 when it is energized by a voltage supplied to its gate from a terminal 20. If the storage element is desired to be set to "0," the digit line 6 is supplied with a potential of 0 V, and, if storage of a "1" is desired, the digit line 6 is maintained at +3 V. The voltage level on the word line 9 is then raised to a potential of +3 V, and then the voltage levels on both word lines is raised another 3 volts, to the quiescent levels.

When a 0 is to be stored, the lines 6, 8, and 9 are all at 0 V, so the potential of the node 13 is also 0 V. When the voltage level on the line 9 is raised, the inherent capacitance between the node 13 and the reference voltage (ground) cannot be charged immediately, and so the low potential at this point, which is connected directly to the gate of the transistor 2, causes the transistor 2 to become conductive as the potential on the line 9 is increased. Therefore, the increased potential on the line 9 is dropped across the resistor 4, supplying an increasing voltage to the gate of the transistor 1, which is thereby rendered conductive and maintains the low potential at the node 13. Thus, both transistors 1 and 2 are conductive, and this state is maintained as the voltage levels on the word lines 8 and 9 are returned to their normal levels.

If the control device is desired to be set to its 1 state, the digit line 6 is maintained at a potential +3 V while the lines 8 and 9 are both at 0 V, forward biasing the diode 50 and holding the potential of the node at a relatively high level (about +3 V). When the potential on the line 9 is increased from 0 V to +3 V, the transistor 2 remains blocked because of the relatively high potential at its gate, maintaining the node 13' at a low potential, and the transistor 1 remains blocked because of the low potential at its gate. Thus, both of the transistors 1 and 2 are blocked, and this state is maintained as the normal voltage levels on the word lines are restored.

Figure 5:
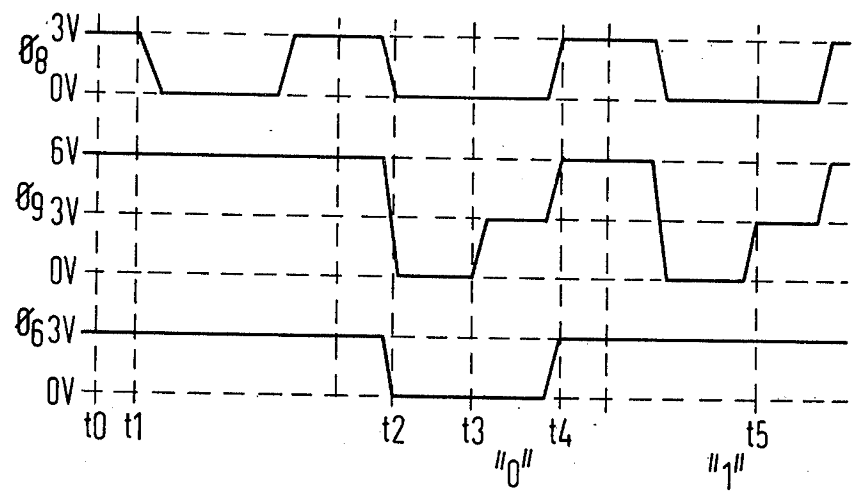
FIG. 5 is an illustration of the voltage levels, relative to time, on three control lines associated with the storage elements of FIGS. 2–4.

The diagrams of FIG. 5 illustrate the voltage levels on the lines 6, 8, and 9 at various times during reading and writing operations. At an initial time *t*0 the storage device of FIG. 2 is in its quiescent state. At time *t*1 the voltage level on the line 8 is reduced from 3 V to 0 V, to perform a reading operation as described above and later restored to normal. At time *t*2 the voltage levels on all three lines are reduced to 0, after which the level on the line 9 is raised to +3 V at time *t*3, and subsequently, at time *t*4, the voltage levels on lines 8 and 9 are both returned to normal. In this way, a 0 is stored. The voltage level on the digit line 6 also is increased to its quiescent level at time *t*4, but this does not interfere with the setting of the storage element to 0.

At a subsequent time, the levels on the lines 8 and 9 are both reduced to 0, while the level on the line 6 is maintained at +3 V, after which, at time *t*5, the level on the line 9 is raised to +3 V, and subsequently the lines 8 and 9 are returned to normal. This completes the operation of setting the storage element to 1.

The circuit of FIG. 2 may be provided with a second diode 50' interconnected between the gate of the transistor 1 and a second digit line 6'. In this way, the state of the storage element is controlled by either or both of the potentials available on the lines 6 and 6'. When two digit lines 6 and 6' are employed in this manner, one may be reserved for reading and one for writing. Alternatively, one of the lines 6 and 6' may be reserved for the reading function and the other reserved for the writing function.

The sense circuit 10 is preferably the same as one of the several alternative sense circuits illustrated and described in the above-identified copending application Ser. No. 457,223, the disclosure of which is hereby incorporated hereinto by reference.

Figure 3:
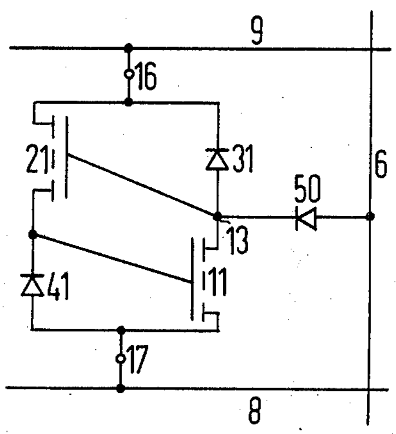
FIG. 3 is a schematic circuit diagram of another embodiment of the present invention which incorporates diodes as load resistances.

In the circuits of FIGS. 1 and 2, the power which is dissipated in the quiescent state is determined primarily by the resistance of the load resistors 3 and 4. It is desirable to make the resistance of these resistors as high as possible, in order to minimize as much as possible the dissipation. In the embodiment of FIG. 3, the load resistors 3 and 4 are replaced with reverse poled diodes 31 and 41, which function as extremely high resistances, since they are poled so as to pass only a leakage current. The transistors 11 and 21 are the same as the transistors 1 and 2 described above in connection with FIGS. 1 and 2.

Figure 4:
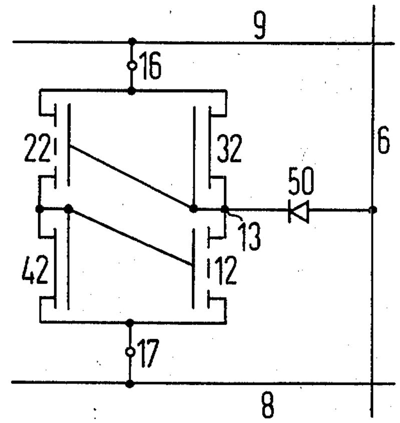
FIG. 4 is a schematic circuit diagram of yet another embodiment of the present invention which incorporates field effect transistors as load resistances.

In the embodiment of FIG. 4, the load resistors 3 and 4 are replaced with field effect transistors 32 and 34, which function as extremely high resistors. The field effect transistors 32 and 42 are preferably of the depletion type (having a blocking layer) or MOS transistors of the deep depletion type. The transistors 12 and 22 are the same as transistors 1 and 2 described above. The gate of the transistor 32 is connected to the node 13, and the gate of the transistor 42 is connected to the other node.

The embodiments of FIGS. 3 and 4 may also be employed with two separate digit lines, as described in connection with FIGS. 1 and 2. The sense and write circuits are the same as in the circuit of FIG. 2.

Figure 6:
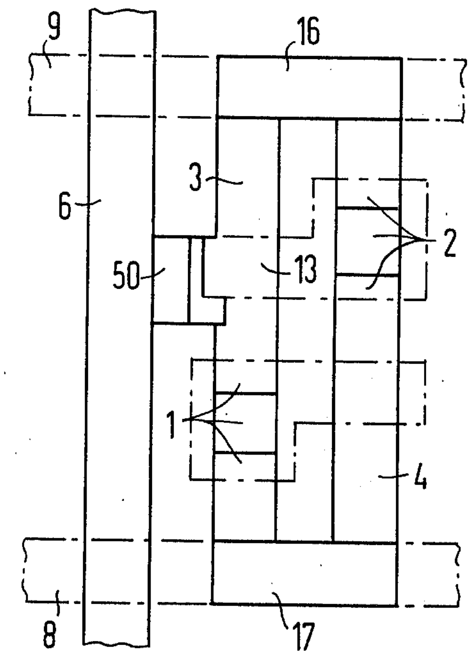
FIG. 6 is a schematic diagram illustrating the construction of the storage element of FIG. 2.

FIG. 6 illustrates a plan view of one way in which the embodiment of FIG. 2 may be constructed with CMOS techniques, the reference numerals in FIG. 6 referring to corresponding parts of the circuit of FIG. 2. The substrate is preferably an insulating material such as sapphire or spinel. A layer of semiconducting silicon is epitaxially grown on the substrate surface, and semiconductor layers are diffused into the silicon layer at desired places in the manner well known to those skilled in the art. The conductors 6, 8, and 9 have been shown only in part, for they are extended beyond the range of illustration of FIG. 6 to cooperate with other storage devices (not shown) on the same substrate. The source and drain zones of the transistors are diffused into the epitaxial silicon layer, and the gate electrode is insulated from the substrate (and from the source and drain) by a layer of $SiO_2$ in the known manner. The conductor paths are preferably formed of aluminum. It is significant that no elaborate techniques are required to establish the cross-coupled relation of the transistors 1 and 2 and, in particular, that no crossing or intersecting connections are employed in any of the circuits of FIGS. 1–4. As will be understood by those skilled in the art, the present invention is not limited to the SOS technique, but may equally well be carried out with other techniques known in the production of integrated circuits, such as solid silicon techniques.

In the foregoing, the present invention has been described with sufficient particularity as to enable others skilled in the art to make and use the same. It will be understood that various modifications and additions may be made, without departing from the essential features of novelty of the present invention, which are intended to be defined and secured by the appended claims.

What is claimed is:

1. A static storage element comprising a storage flip-flop with first and second interconnected branches, said first branch comprising a first field effect switching transistor and a first two-pole load element connected in series, said second branch comprising a second field effect switching transistor and a second two-pole load element connected in series, a supply voltage source connected to both of said branches, said first and second field effect transistors being formed with complementary conductivity, the sequence of connection of field effect switching transistor and load element of said second branch, relative to said voltage source, being the opposite of the sequence of connection of the field effect transistor and load element in said first branch, first connecting means for connecting the gate of said first field effect transistor with the node between the second field effect switching transistor and its associated load, and second connecting means for connecting the gate of said second field effect switching transistor with the node between said first field effect switching transistor and its associated load without intersecting with said first connecting means.

2. Apparatus according to claim 1, wherein said load elements comprise resistors, and including a selector transistor connected between a node of said storage element and a digit line, and means for connecting a control terminal of said selector transistor with a word line.

3. Apparatus according to claim 1, including a diode connected between a node of said storage element and a digit line, means including a first word line for connecting said first voltage source to said storage element, and means including a second word line for connecting said second voltage source to said storage element.

4. Apparatus according to claim 3, wherein said load elements comprise resistors.

5. Apparatus according to claim 3, wherein said load elements comprise diodes poled so as to pass only a blocking current.

6. Apparatus according to claim 3, wherein said load elements are field effect transistors of the depletion type, and including means for connecting the gate of each of said depletion field effect transistor to the node between said depletion field effect transistor and its associated switching transistor.

7. Apparatus according to claim 1, wherein said storage element is constructed by diffusing semiconducting layers into an epitaxial silicon layer grown on an insulating substrate.

8. Apparatus according to claim 1, wherein said storage element is formed by employing solid silicon techniques.

9. Apparatus according to claim 1, including a selector gate connected between a digit line and a node of said storage element, means for energizing said selector gate to initiate a reading operation, whereby said digit line assumes a potential corresponding to that present at said node of said storage element, and means for impressing a given voltage on said digit line for causing said node to assume said given voltage during a writing operation, whereby said storage element is set to one or another of its stable states in accordance with the potential on said digit line.

10. An electronic integrated circuit formed of semiconductor material comprising a storage flip-flop with first and second interconnected branches, said first branch comprising a first field effect switching transistor and a first two-pole load element connected in series, said second branch comprising a second field effect switching transistor and a second two-pole load element connected in series, a supply voltage source connected to both of said branches, said first and second field effect transistors being formed with complementary conductivity, the sequence of connection of field effect switching transistor and load element of said second branch, relative to said voltage source, being the opposite of the sequence of connection of the field effect transistor and load element in said first branch, first connecting means for connecting the gate of said first field effect transistor with the node between the second field effect switching transistor and its associated load, and second connecting means for connecting the gate of said second field effect switching transistor with the node between said first field effect switching transistor and its associated load without intersecting with said first connecting means.

11. Apparatus according to claim 10, wherein said integrated circuit is formed on a monolithic semiconductor chip, with said storage flip-flop formed on one side of said chip.

12. A static storage element comprising a storage flip-flop with first and second interconnected branches, said first branch comprising a first field effect switching transistor and a first two-pole load element connected in series, said second branch comprising a second field effect switching transistor and a second two-pole load element connected in series, a supply voltage source having only two terminals connected to both of said branches, said first and second field effect transistors being formed with complementary conductivity, the sequence of connection of field effect switching transistor and load element of said second branch, relative to one of said terminals, being the opposite of the sequence of connection of the field effect transistor and load element in said first branch, first connecting means for connecting the gate of said first field effect transistor with the node between the second field effect switching transistor and its associated load, and second connecting means for connecting the gate of said second field effect switching transistor with the node between said first field effect switching transistor and its associated load without intersecting with said first connecting means.

13. Apparatus according to claim 12, wherein each of said branches is directly connected to said two terminals, with one end of each branch connected to one of said terminals and the other end of each branch connected to the other of said terminals.

* * * * *